United States Patent [19]

Lehrer

[11] 4,359,490

[45] Nov. 16, 1982

[54] METHOD FOR LPCVD CO-DEPOSITION OF METAL AND SILICON TO FORM METAL SILICIDE

[75] Inventor: William I. Lehrer, Los Altos, Calif.

[73] Assignee: Fairchild Camera & Instrument Corp., Mountain View, Calif.

[21] Appl. No.: 282,768

[22] Filed: Jul. 13, 1981

[51] Int. Cl.$^3$ ............................................ H01L 21/285
[52] U.S. Cl. ........................................ 427/95; 427/99; 427/255.2; 427/126.1
[58] Field of Search ................... 427/255.2, 93, 95, 99, 427/126.1

[56] References Cited

U.S. PATENT DOCUMENTS

| | | | |
|---|---|---|---|
| 3,381,182 | 4/1968 | Thornton | 29/576 |
| 3,540,920 | 11/1970 | Wakefield | 427/255.2 |
| 3,881,242 | 5/1975 | Nuttall | 29/589 |
| 4,180,596 | 12/1979 | Crowder | 427/93 |
| 4,276,557 | 6/1981 | Levinstein | 357/71 |

OTHER PUBLICATIONS

Kern, "Advances in Deposition Processes for Passivation Films", J. Vac. Sci. Technol, vol. 14, No. 5, Sep.-/Oct. 1977, pp. 1082–1099.

*Primary Examiner*—John D. Smith
*Attorney, Agent, or Firm*—Ken Olsen; Theodore Scott Park; Michael J. Pollock

[57] ABSTRACT

A low temperature LPCVD process for co-depositing metal and silicon to form metal silicide on a surface such as the surface of a semiconductor integrated circuit wherein the metal is selected from the group consisting of tungsten, molybdenum, tantalum and niobium. A reactor which contains the surface is maintained at a temperature of about 500°–700° C. The reactor is purged by the successive steps of introducing an inert gas into the reactor, introducing a reducing atmosphere into the reactor and introducing hydrogen chloride gas into the reactor. Silane is then introduced into the reactor such that a base layer of polysilicon is formed on the surface. Then, while maintaining silane introduction to the reactor, metal chloride vapor is simultaneously introduced into the reactor such that metal and silicon are co-deposited on the polysilicon as metal silicide.

11 Claims, No Drawings

METHOD FOR LPCVD CO-DEPOSITION OF METAL AND SILICON TO FORM METAL SILICIDE

TECHNICAL FIELD

This invention relates to deposition of metal silicides and particularly to a low pressure chemical vapor deposition (LPCVD) process for co-depositing metal and silicon to form metal silicide on a surface such as, for example, a semi-conductor integrated circuit.

BACKGROUND ART

Metal silicides have attracted increasing attention recently as possible interconnect material for semiconductor integrated circuits. In particular, bilayer composite films of metal silicide and polycrystalline silicon have been found to provide low resistance gate and interconnect layers for MOS circuits and to be otherwise compatible with current silicon gate technology.

Tungsten disilicide has received particular attention as a candidate for such applications because its electrical resistivity is among the lowest of the metal silicides. In addition, tungsten disilicide grows a passivating silicon oxide layer if a silicon source is available and it is not attacked by HF solutions. Films of tungsten disilicide have been formed by sintering films of tungsten metal deposited on silicon by evaporation, sputtering, or chemical vapor deposition (CVD). They have also been formed by sintering mixed films of tungsten and silicon formed by co-evaporation, co-sputtering, or sputtering from a tungsten disilicide target.

In the fabrication of semiconductor integrated circuits, CVD methods are often preferred to physical deposition processes because CVD metal silicide films usually show more even step coverage than sputtered or evaporated film and the costs can be lower. In addition, CVD methods are production oriented and can result in purer films.

A basic problem, however, in depositing metal silicides by CVD methods is that it is sometimes difficult to deposit the metal component at the temperatures required for safe semiconductor device fabrication. For example, typical deposition temperatures for tantalum or titanium are over 1000° C., a temperature at which the junctions of a semi-conductor integrated circuit become damaged. A convenient temperature for deposition of metal silicides would be about 600°–650° C.

DISCLOSURE OF THE INVENTION

The present invention provides a low temperature process for depositing metal silicide, in situ, by the co-deposition of metal and silicon utilizing low pressure chemical vapor deposition techniques.

According to the process, a LPCVD reactor which is maintained at about 500°–700° C. and which contains a surface, such as the surface of a semiconductor integrated circuit, upon which metal silicide is to be deposited is first purged to remove oxidizing species. The initial purge comprises the successive steps of introducing an inert gas into the reactor, introducing a reducing atmosphere into the reactor, and introducing hydrogen chloride gas into the reactor. Next, silane is introduced into the reactor such that a base of polysilicon is deposited on the surface. Then, as silane introduction continues, a metal chloride vapor is introduced into the reactor such that metal and silicon are co-deposited on the polysilicon base as metal silicide. Following the co-deposition step, the reactor is purged by introducing a reducing atmosphere into the reactor. Finally, a neutral or inert gas is introduced into the reactor.

The thickness of the metal silicide deposition on the surface depends on the length of time that silane and metal chloride are simultaneously introduced into the reactor, the concentrations of silane and metal chloride and the temperature within the reactor.

BEST MODE FOR CARRYING OUT THE INVENTION

The process of the present invention is generally applicable to the co-deposition of metal and silicon to form metal silicide on a surface wherein the metal is selected from the group consisting of tungsten, molybdenum, tantalum and niobium. However, the process will be described below using the co-deposition of tantalum and silicon to form tantalum silicide on the surface of a semiconductor integrated circuit as an example.

A conventional low pressure chemical vapor deposition reactor which contains a semiconductor integrated circuit is maintained at a temperature of about 500° C.–700° C., preferably about 600° C.–650° C. In a preferred embodiment of the invention, the reactor temperature profile is 610° C. at the front end of the reactor to 630° C. at the back end of the reactor.

Prior to the introduction of any process gases to the reactor, reactor pressure is reduced, typically to the base pressure of the LPCVD system. In the preferred embodiment, the pressure within the reactor is maintained at about 0.1–0.3 torr.

After the desired temperature and pressure conditions have been established, conventional initial CVD purging steps are utilized to clean the interior of the reactor. Reactor cleanliness is critical to successful deposition of metal silicide. First, an inert gas, preferably argon or nitrogen, is introduced into the reactor. This is followed by the introduction into the reactor of a reducing atmosphere, preferably hydrogen gas. Introduction of a reducing atmosphere is then followed by introduction of hydrogen chloride gas. According to the preferred embodiment, the hydrogen chloride gas is introduced such that it etches contaminants from the surface of the semiconductor integrated circuit upon which metal silicide is to be deposited to produce an atomically clean surface.

After the initial purge of the reactor has been completed, silane is introduced into the reactor such that a base layer of polysilicon is deposited upon the surface of the semiconductor integrated circuit. Preferably, silane is introduced at a rate sufficient to maintain a reactor pressure of about 0.3 torr. Those skilled in the art will appreciate that this rate will depend upon the geometry of the specific reactor utilized.

Next, tantalum and silicon are simultaneously co-deposited to form a layer of tantalum silicide on the polysilicon base. Co-deposition of tantalum and silicon to form tantalum silicide is accomplished by maintaining silane flow while simultaneously introducing tantalum chloride vapor to the reactor. Silane is introduced at a rate sufficient to maintain a partial pressure of about 0.2 torr. The tantalum chloride vapor is introduced at a rate sufficient to maintain the total pressure at about 0.275 torr. In the preferred embodiment, the tantalum chloride vapor is introduced into the reactor using hydrogen as a carrier gas (In the case where another metal selected from the group listed above is used, the carrier gas may be hydrogen or may not be required.). The thickness of the tantalum silicide layer deposited on the polysilicon base depends on the length of time that silane and tantalum chloride are simultaneously introduced to the reactor as well as on the concentrations of silane and tantalum chloride and the temperature within the reactor.

The tantalum chloride gas is generated from solid tantalum chloride, typically a powder, contained in a saturator contained inside an oven maintained at about 100°–175° C. Also within the oven are heat exchangers which preheat the hydrogen carrier gas prior to its pass through the saturator. The heated hydrogen carrier gas is then mixed with the source gas containing tantalum chloride. The lines leading from the source oven to the reactor are maintained at about 50° C. above the temperature of the oven to avoid condensation of the tantalum chloride.

Tantalum silicide is deposited on the surface of the semiconductor device at a rate of about 100–300 Angstroms per minute. The lower the rate, the greater the accuracy of deposition. A preferred deposition rate is about 100–200 Angstroms per minute.

Following the deposition of tantalum silicide, the reactor is again purged. First, a reducing atmosphere, preferably hydrogen gas, is introduced into the reactor for about ten minutes at a pressure of about 0.3 torr. Finally, an inert atmosphere, preferably argon or nitrogen gas, is introduced into the reactor for about ten minutes at a pressure of about 10 torr.

I claim:

1. A process for co-depositing metal and silicon to form metal silicide on a surface such as the surface of a semiconductor integrated circuit wherein said metal is selected from the group consisting of tungsten, molybdenum, tantalum and niobium, comprising:
   (a) maintaining a reactor which contains said surface at a temperature of about 500°–650° C.;
   (b) purging said reactor by the successive steps of
      (i) introducing an inert gas into said reactor,
      (ii) introducing a reducing atmosphere into said reactor, and
      (iii) introducing hydrogen chloride gas into said reactor;
   (c) introducing silane into said reactor such that a base layer of polysilicon is formed on said surface; and
   (d) while maintaining silane introduction into said reactor, simultaneously introducing metal chloride vapor into said reactor such that metal and silicon are co-deposited on said polysilicon as metal silicide.

2. A process as in claim 1 wherein said reactor is a low pressure chemical vapor deposition reactor.

3. A process as in claim 2 wherein the pressure within said reactor is maintained at about 0.1–0.3 torr.

4. A process as in claim 3 wherein said reactor is maintained at a temperature of about 600°–650° C.

5. A process for co-depositing tantalum and silicon to form tantalum silicide on a surface such as the surface of a semiconductor integrated circuit, comprising:
   (a) maintaining a reactor which contains said surface at a temperature of about 500°–650° C.;
   (b) purging said reactor by the successive steps of
      (i) introducing an inert gas comprising either argon gas or nitrogen gas into said reactor,
      (ii) introducing hydrogen gas into said reactor, and
      (iii) introducing hydrogen chloride gas into said reactor;
   (c) introducing silane into said reactor such that a base layer of polysilicon is formed on said surface;
   (d) while maintaining silane introduction into said reactor, simultaneously introducing tantalum chloride vapor into said reactor such that tantalum and silicon are co-deposited on said polysilicon as tantalum silicide.

6. A process as in claim 5 wherein said silane is introduced into said reactor at a rate sufficient to maintain a partial pressure of about 0.2 torr.

7. A process as in claim 6 wherein said tantalum chloride vapor is introduced into said reactor at a rate sufficient to maintain a total pressure of about 0.275 torr.

8. A process as in claim 7 wherein said tantalum chloride vapor is introduced to said reactor using a carrier gas.

9. A process as in claim 8 wherein said carrier gas is hydrogen.

10. A process as in claim 8 wherein said carrier gas is an inert gas.

11. A process as in claim 10 wherein said inert gas is argon.

* * * * *